United States Patent
Zoppas et al.

(10) Patent No.: US 11,565,738 B2
(45) Date of Patent: Jan. 31, 2023

(54) HEATING AND CAPACITIVE SENSING DEVICE FOR A STEERING WHEEL OF A VEHICLE

(71) Applicant: I.R.C.A. S.P.A. INDUSTRIA RESISTENZE CORAZZATE E AFFINI, Vittorio Veneto (IT)

(72) Inventors: Federico Zoppas, Treviso (IT); Mauro Berioli, Vittorio Veneto (IT); Roberto Oboe, Vicenza (IT); Michele Peterle, San Pietro di Feletto (IT); Paolo Magnone, Vicenza (IT)

(73) Assignee: I.R.C.A. S.P.A. INDUSTRIA RESISTENZE CORAZZATE E AFFINI, Vittorio Veneto (IT)

( * ) Notice: Subject to any disclaimer, the term of this patent is extended or adjusted under 35 U.S.C. 154(b) by 623 days.

(21) Appl. No.: 16/609,616

(22) PCT Filed: May 4, 2018

(86) PCT No.: PCT/IB2018/053122
§ 371 (c)(1),
(2) Date: Oct. 30, 2019

(87) PCT Pub. No.: WO2018/203299
PCT Pub. Date: Nov. 8, 2018

(65) Prior Publication Data
US 2020/0062289 A1    Feb. 27, 2020

(30) Foreign Application Priority Data

May 4, 2017   (IT) .................. 102017000048117

(51) Int. Cl.
*B62D 1/06*    (2006.01)
*B62D 1/04*    (2006.01)
*H03K 17/96*   (2006.01)

(52) U.S. Cl.
CPC ............ *B62D 1/065* (2013.01); *B62D 1/046* (2013.01); *H03K 17/962* (2013.01)

(58) Field of Classification Search
CPC ....... B62D 1/046; B62D 1/065; H03K 17/962
See application file for complete search history.

(56) References Cited

U.S. PATENT DOCUMENTS

2011/0153160 A1*  6/2011  Hesseling ............... B62D 5/006
                                                 701/1
2016/0096543 A1*  4/2016  Naitou ..................... H05B 3/34
                                                 219/204

(Continued)

FOREIGN PATENT DOCUMENTS

| JP | S63305074 A  | 12/1988 |
| JP | H11163476 A  | 6/1999  |
| JP | 2003019964 A | 1/2003  |

*Primary Examiner* — Dana Ross
*Assistant Examiner* — Joe E Mills, Jr.
(74) *Attorney, Agent, or Firm* — Amster Rothstein & Ebenstein LLP (57) ABSTRACT

A heating and capacitive sensing device for a steering wheel of a motor vehicle. The device includes a support made from an electrically insulating flexible material to which at least an electrically conductive first track and at least an electrically conductive second track are fixed. An electronic control unit including a capacitance reading module is electrically connected to the at least one second track. The electronic control unit is configured to control the at least one first track and at least one second track, so that the at least one first track is suited to generate heat for heating the steering wheel, and at least one second track is configured to operate as a capacitive sensor means by sending capacitance values to the electronic control unit.

21 Claims, 8 Drawing Sheets

(56) References Cited

U.S. PATENT DOCUMENTS

2017/0079089 A1\* 3/2017 Okazaki .................. H05B 3/20
2018/0022374 A1\* 1/2018 Fujikawa ............... B62D 1/065
219/204

\* cited by examiner

HEATING AND CAPACITIVE SENSING DEVICE FOR A STEERING WHEEL OF A VEHICLE

CROSS-REFERENCE TO RELATED APPLICATIONS

This application claims priority to PCT application no. PCT/IB2018/053122, filed May 4, 2018, which claims priority to Italian application no. 102017000048117, filed May 4, 2017, the contents of which are incorporated by reference in their entireties.

FIELD OF THE INVENTION

The present invention relates to a device, in particular to an electrical device, for the steering wheel of a vehicle, e.g. a motor vehicle.

PRIOR ART

In recent years, safety has become an aspect of the utmost importance in the automotive market, which is increasingly addressing the concept of self-driving or intelligent cars.

To this end, the ADAS (Advanced Driver Assistance System), i.e. a high-performance electronic driving assistance system, has been developed to help avoiding errors which often occur during driving in order to prevent accidents.

In particular, the ADAS comprises a multiplicity of functions, developed for assisting the driver of a vehicle, alerting him or her in case of danger or emergency, so as to limit the risk of collision with other vehicles or pedestrians.

Of particular interest among the ADAS functions is the HOD (Hands Off Detection) function, performed by a sensing device, e.g. of a capacitive or optical type, integrated in the steering wheel of a motor vehicle and suited to ensure that the driver maintains control of the motor vehicle while driving.

Currently, the steering wheel torque control (torque sensor) is used to sense whether the driver has his or her hands on the steering wheel, but displays some criticalities, in particular because it can cause false readings due to the movement of the steering wheel when the car is moving, even if the driver's hands are not on the steering wheel.

Therefore, the need to overcome the disadvantages of the prior art is felt.

SUMMARY OF THE INVENTION

It is an object of the present invention to provide a single device which allows both the heating and the capacitive sensing for the steering wheel of a motor vehicle.

It is another object of the present invention to provide a device which allows a better capacitive sensing than the prior art.

It is a further object of the present invention to provide a device which allows a better heating of the steering wheel than the prior art.

At least one of such objects is achieved by means of a heating and capacitive sensing device for a steering wheel of a vehicle according to claim 1.

According to another aspect, the invention provides a steering wheel for a vehicle, the steering wheel comprising either a device as defined above or a flexible conductive element as defined above.

For example, the invention provides a steering wheel for motor vehicle with which the heating device and the capacitive sensing as defined above is associated, in particular fixed.

Preferably, but not exclusively, the at least one first track and the at least one second track are either incorporated in the support or are fixed to a surface or face, e.g. an outer face, of the support.

Advantageously, the invention provides a single component, i.e. the conductive element flexible, configured to perform both the heating function and the sensor function, by means of respective conductive tracks dedicated, preferably exclusively, to the heating and to the sensor function.

Advantageously, the heating and the capacitive sensing device for the steering wheel of a motor vehicle may be used with capacitive elements of any size, i.e. so that it is not necessary to replace the microcontroller according to the size of the capacitive element used.

Advantageously, according to an aspect, by providing at least one capacitor, in particular a capacitor in series with the capacitive track (or sensor track), the capacitance value input to the microcontroller, in particular input to the capacitance reading module of the microcontroller, is reduced. In this manner, the same microcontroller, in particular the same capacitance reading module, can be used regardless of the size and geometry of the flexible conductive element.

Preferably, the saturation level of the microcontroller, in particular of its capacitance reading module, is relatively low, e.g. up to or equal to 1000 pF. Preferably, when provided, a capacitor with capacitance of up to or equal to 1000 pF or 2000 pF is used, which preferably has a capacitance value which is stable as temperature varies, e.g. in the range from −40 to +85° C.

Advantageously, according to an aspect, by cyclically connecting and disconnecting the at least one first track, or heating track, to and from the power source and ground, the heating track is used to make a shielding. In particular, during the capacitance reading, when the heating track is disconnected from the power supply and from ground, the electronic control unit, or ECU, puts the heating track at the same potential as the track of the capacitive sensor, i.e. the at least one second track. In this manner, it is possible to prevent environmental factors, such as humidity, from determining "false touches" of the steering wheel. Advantageously, according to an aspect, a MOSFET is provided which limits, typically adjusts, the current intensity crossing through the heating track when such current exceeds a predetermined threshold value.

Advantageously, according to an aspect, at least one metal element is provided which acts as a thermal bridge between the electronic control unit and the metal frame of the steering wheel, in particular in order to dissipate heat. Undesired overheating of the electronic control unit is prevented in this manner.

Advantageously, according to an aspect, two or more temperature sensors are provided adapted to be fixed to the steering wheel, e.g. two, three or four temperature sensors. By virtue of the appropriately arranged, e.g. equally spaced apart, temperature sensors, the heating of the steering wheel by means the heating track can be controlled according to the actual temperature of multiple zones of the steering wheel.

Advantageously, the at least one first conductive track is distinct, i.e. different, from the at least one second conductive track.

Preferably, but not exclusively, only one first conductive track and only one second conductive track are provided.

Preferably, but not exclusively, the at least one first conductive track and at least one second conductive track are planar and therefore different from a wire. In particular, the at least one first conductive track and at least one second conductive track are foils which have one dimension much smaller than the other two dimensions.

Preferably, the touch or proximity sensing is performed exclusively by measuring the variation of capacitance, meaning that the measurement of the capacitance variation measurements is the only physical parameter used to sense the contact or the proximity of the driver's hand or hands.

Typically, but not exclusively, the expression "flexible conductive element" means a component with one or more parts made of electrically insulating material and one or more parts made of electrically conducting material. The flexible conductive element, or "Flex Foil", belongs to the field of flexible electronics and may also be referred to as a flexible circuit in English.

The dependent claims describe particular embodiments of the invention.

BRIEF DESCRIPTION OF THE FIGURES

Further features and advantages of the present invention will be more apparent from the following description of some embodiments, provided by way of non-limiting example, with reference to the accompanying drawings, in which.

The same references in the figures identify the same members.

DETAILED DESCRIPTION OF EXAMPLE EMBODIMENTS OF THE INVENTION

Figure 1:
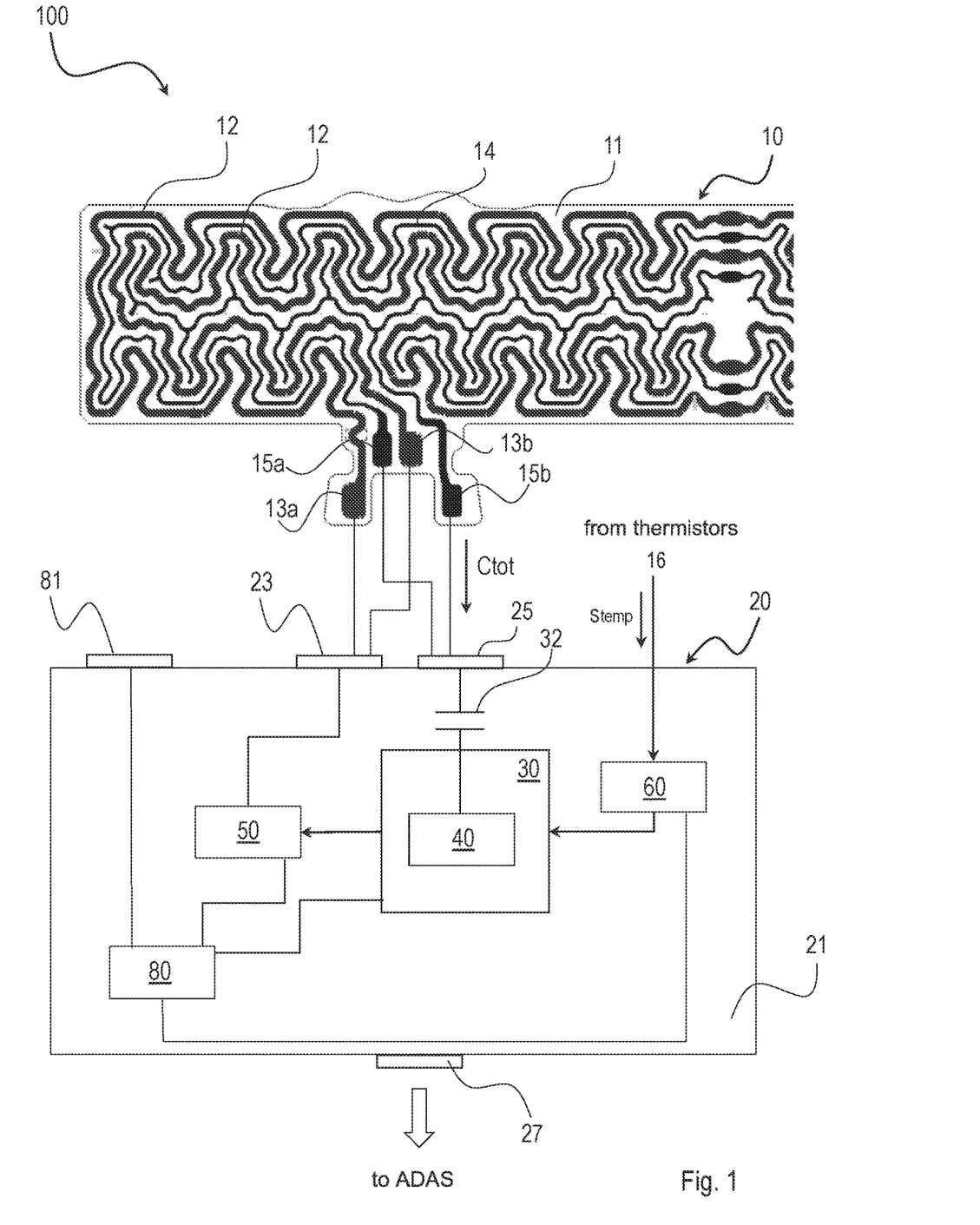
FIG. 1 shows a diagrammatic section view of a device according to the invention.
Figure 2:
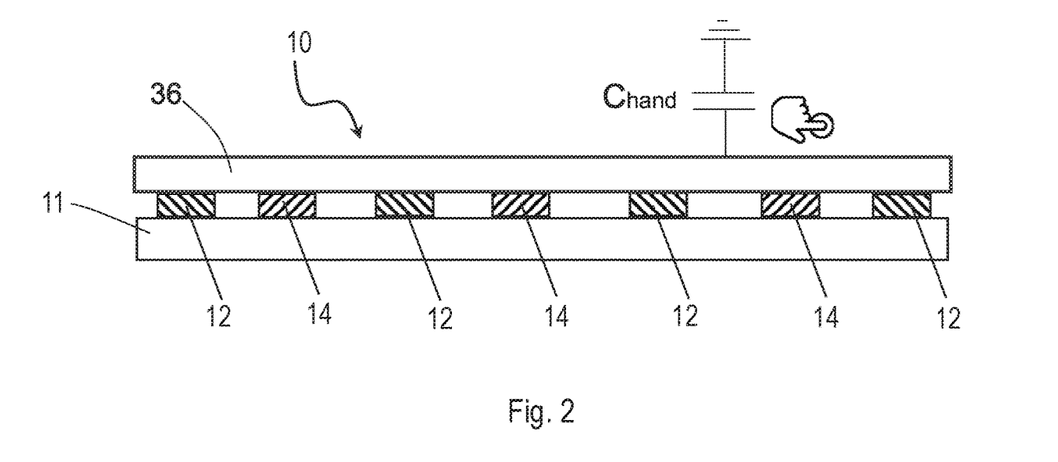
FIG. 2 shows a diagrammatic front section view of a component of the device in FIG. 1.

FIGS. 1 and 2 in particular diagrammatically illustrate a heating and capacitive sensing device for a steering wheel V (diagrammatically shown in FIG. 7) of a motor vehicle according to the present invention. The heating and the capacitive sensing device according to the invention, generally indicated by reference numeral 100, comprises a flexible conductive element 10, or the flexible circuit, and an electronic control unit, or ECU, 20. The ECU 20 is electrically connected to the flexible conductive element 10 and is adapted to be connected to an electrical power source, e.g. to the electrical supply of the motor vehicle.

The flexible conductive element 10 comprises a layer of insulating material 11, which is an electrically insulating flexible support, and a plurality of conductive tracks 12, 14 fixed to the insulating layer 11. In more detail, the conductive tracks 12, 14 comprise at least one track 12 configured to be used as heating means, hereinafter also named as heating track, and at least one track 14 configured to be used as capacitive sensor means, hereinafter also named as capacitive sensor track or capacitive track. In the non-limiting example shown in the Figures there is only one heating track 12 and only one capacitive track 14. According to another non-limiting example (not shown), a single heating track and two capacitive tracks are provided, preferably the two capacitive tracks being connected at two respective terminals.

By way of non-limiting example only, the flexible conductive element 10 can be made by etching a metallic foil fixed to the insulating layer, or by crosslinking a silicone support, on which the conductive tracks formed by cutting, e.g. by laser cutting, are arranged.

Preferably, but not exclusively, the flexible conductive element 10 is shaped as a substantially rectangular band. Optionally, the flexible conductive element 10 is extensible, being plastically and/or elastically deformable. In particular, the at least one insulating layer 11 is extensible, being plastically and/or elastically deformable, e.g. plastically deformable up to approximately 10-20% with respect to a rest configuration or initial configuration.

Preferably, the thickness of the flexible conductive element 10 is comprised between 0.1 and 1 mm, or between 0.1 and 0.6 mm, or between 0.3 and 1 mm, or between 0.3 and 0.6 mm; for example, the thickness is equal to about 0.3 mm or is equal to about 0.6 mm. Such thickness of the flexible conductive element 10 substantially corresponds to the overall thickness of the at least one insulating layer 11, e.g. of one or two insulating layers, and of the at least one conductive track 12, or equivalently to the overall thickness of the at least one insulating layer 11 and of at least one conductive track 14.

Preferably, the flexible conductive element 10 is much thinner than its length and width, where the length and the width substantially correspond to the length and the width of the at least one insulating layer 11. For example, the length can be between 900 and 1200 mm and the width can be between 80 and 160 mm, or between 80 and 100 mm. The size of the conductive flexible element can still be selected according to the size of any steering wheel on which it is provided that the flexible conductive element is applied.

In the embodiment shown in the figures, the flexible conductive element 10 comprises only one layer of insulating material 11, on which the respective conductive tracks 12, 14 are fixed. However, alternatively, the flexible conductive element 10 can be formed by the superposition of two or more layers of insulating material 11, each of which may or may not be provided with the respective conductive tracks 12, 14. In this case, for example, the conductive tracks are arranged between two layers of insulating material. In particular, an example of device according to the invention comprises two insulating layers, between which at least one first track 12 and at least one second track 14 are arranged, substantially forming a sandwich; preferably the two insulating layers are made of PVC; and preferably each of the two insulating layers has a thickness of about 0.2 mm. One of the two layers may be arranged on the body of the steering wheel V, e.g. on the metal frame of the steering wheel, and the other insulating layer may be lined with a lining layer, e.g. leather. Advantageously, in this manner, the lining layer will not have protrusions due to the conductive tracks.

The material of the layer or of the insulating layers 11, or more in general of the insulating flexible support, is typically a polymer material. By way of non-limiting example only, insulating materials are PVC, PTFE, PS, PP, PE, PC, ABS, PET, PA, PU (also expanded), PUR, NBR, silicone, EPDM and the like, optionally with additives. In general, thermoplastics and elastomers having adequate elongation properties may be used.

The conductive tracks, i.e. the heating track 12 and the capacitive track 14, can have a complex geometry. For example, they can have substantially the shape of a serpentine and optionally side branches are present. The mutual arrangement of the conductive tracks may be, by way of example only, such that one or more sections of the track 14 are arranged between two stretches of the track 12. The conductive tracks 12, 14 are connected to the electronic control unit 20 through respective contacts, or contact portions, or terminations, 13a, 13b and 15a, 15b. These contact portions are typically named "pad(s)". Typically but not exclusively, one pad is provided for each track. Optionally, two or more pads are grouped together and enclosed in a connector. Preferably, the pads 15a, 15b are in mutual contact.

According to another example (not shown), two capacitive tracks are provided, each capacitive track has only one pad, and the pads of the two capacitive tracks are electrically connected to each other so as to be in electric short-circuit.

The heating track 12, typically closed circuit, is connected by means of the contacts 13a, 13b, to respective pads of a connection area or connection interface 23 of the electronic control unit 20. The heating tracks 12 fulfill the heating function of the steering wheel V of the motor vehicle by generating heat by Joule effect when supplied. The capacitive track 14 which may be a closed circuit or open circuit is connected through connectors 15a, 15b to a pad 25, which is a connection area, of the electronic control unit 20. A connector 27, preferably for connecting to an ADAS system, is also provided. Furthermore, an area or supply interface 81 is also provided, adapted to be connected to a source of electrical power, e.g. the battery of an automobile. The supply interface is electrically connected to a power module 80 which is connected to the microcontroller 30, to the output power for heating 50, and to the temperature monitoring module 60 to supply them electrically.

By way of non-limiting example only, the materials with which each conductive track can be made are aluminum, constantan, copper, German silver, steel, Inconel, brass and the like. Preferably, the conductive tracks 12, 14 are made of aluminum. Preferably, the thickness of the conductive tracks 12, 14 is comprised between 10 and 200 μm, e.g. between 15 and 150 μm.

In use, the flexible conductive element 10 of the device 100 is fixed, preferably glued, onto the surface of the steering wheel V of a motor vehicle or of a vehicle in general, and subsequently it is lined with a layer 36, typically made of leather.

Figure 3:
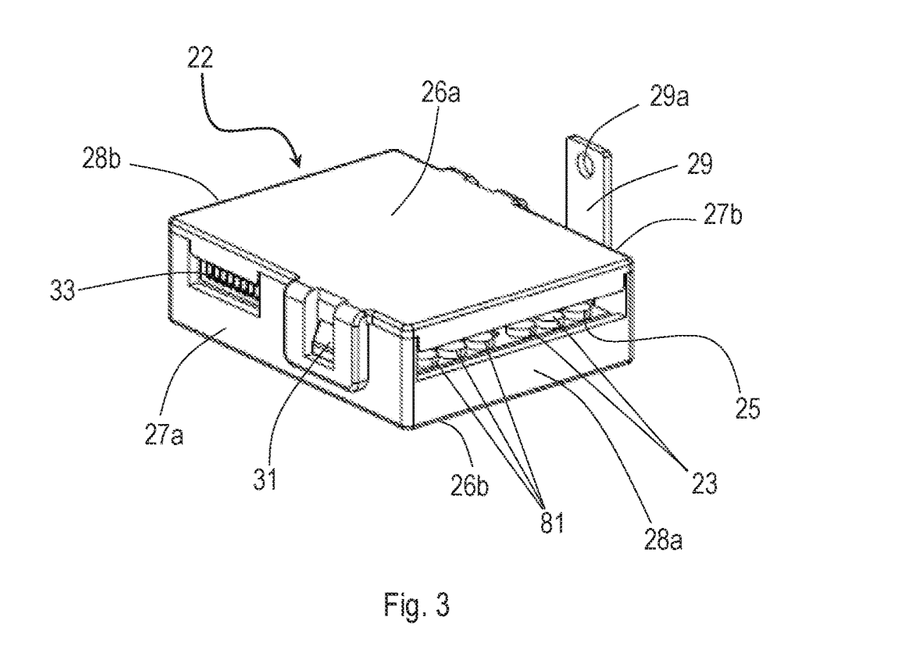
FIG. 3 shows a perspective view of an embodiment of the device in FIG. 1.

The electronic control unit 20 comprises a printed circuit board (PCB—Printed Circuit Board) 21 contained inside a housing 22 (FIG. 3). Preferably, the housing 22 of the PCB 21 is dimensioned so to be able to be inserted inside the structure of the steering wheel V of the motor vehicle.

Preferably, the housing 22 is substantially box-shaped. In the example shown in FIG. 3, the housing 22 is substantially parallelepiped-shaped, although it is apparent that a person skilled in the art may also choose another type of shape. Typically, the housing 22 comprises an upper wall 26a, a bottom wall 26b and mutually opposite side walls 27a, 27b and 28a, 28b. Connectors 23 and 25 are provided at the side wall 28a, adapted to be connected, respectively, with the connectors 13a, 13b of the heating track (or tracks) 12 and with the connectors 15a, 15b of the capacitive track (or tracks) 14 of the conductive element 10, as described previously.

Preferably, the housing 22 is openable. For this purpose, at the side wall 27a closing means 31, e.g. a clip, are provided. Preferably, at an opening in a wall of the housing 22, a connector 33, preferably a connector of the type with 6 or 8 pins, is provided. In this case, pins are provided: Lin bus and digital output directed to the ADAS system; steering wheel temperature sensor input; serial port for connection with PC. For example, pin 1 and 3: Lin bus+digital output (0-5 Vdc) directed to the ADAS system; pin 2 and 6 for connection to the ground line; pin 4 and 5: input for one or more steering wheel temperature sensors; pin 7 and 8 (optional): transmission and reception channels of the serial port for communication with PC, respectively.

A heat conductive fin or strip 29, preferably of metal, e.g., aluminum, rises from the side wall 27b, opposite to the wall 27a. The strip 29 is provided with a hole 29a for connecting to the metal frame of steering wheel V of the motor vehicle. In particular, as will be described in greater detail below in the present description, the metal strip 29 acts as a thermal bridge between the printed circuit board 21 and the metal frame of steering wheel V, in order to use the metal frame itself as a heat sink.

The electronic control unit 20 is electrically connected with the capacitive track 14 of the conductive element 10 and measures a capacitance, defined overall capacitance, Ctot. As will be explained in greater detail, the capacitance Ctot has a different value according to whether the driver touches the steering wheel on which the flexible conductive element 10 is fixed or not. Indeed, the ECU 20 can measure an increase of capacitance indicated with Chand (FIG. 2), which is generated when the driver puts his or her hands either near or in contact with the steering wheel V. The increase of capacitance is relative to a baseline capacitance value Cbaseline.

The total capacitance value C tot, typically in form of a digital signal, is transmitted by the electronic control unit 20 to another electronic control unit, e.g. to the ADAS of the motor vehicle. Transmission takes place through an appropriate interface bus or digital output type, e.g. through the connection interface 27 (FIG. 1) which can be connected to an electronic control unit, in particular the ADAS.

In more detail, the electronic control unit 20 comprises a controller 30, or microcontroller, adapted to receive the capacitive signal associated with the capacitance Ctot in input. The controller 30 comprises a capacitance reading module 40. By way of example only, the capacitance reading module 40 uses CapSense technology. The capacitance reading module 40 is configured to read a baseline capacitance value Cbaseline, which is typically equal to the difference of capacitance between the capacitive track 14 and ground. When the user's hand does not touch the steering wheel onto which the conductive element 10 is fixed, the controller 30 reads a total capacitance Ctot=Cbaseline through the capacitance reading module 40. When the user touches the steering wheel onto which the conductive element 10 is fixed with one or both hands or with his or her fingers, the controller 30 reads a total capacitance Ctot=Cbaseline+Chand through the capacitance reading module 40. The capacitance value Chand is thus summed, in particular added, to the value Cbaseline.

Advantageously, the electronic control unit 20 also comprises at least one capacitor, preferably a capacitor 32 connected in series between the connector 25 of capacitive input signal Ctot and the capacitance reading module 40 of the controller 30. When multiple capacitors are provided, the capacitors are connected in series.

Preferably, the capacitor 32 is arranged between the connection area 25, to which the capacitive track 14 and the controller 30 are connected, i.e. outside the latter.

The capacitor 32 is connected in series between the capacitive signal Ctot, transmitted by the conductive track 14, and the capacitance reading module 40 and makes it possible to partially attenuate the capacitive signal Ctot. In fact, this makes it possible to increase the dynamic of the capacitance reading module 40 which can work advantageously with a wider margin with respect to its own level of saturation.

The presence of the capacitor 32 thus makes it advantageously possible to use the same electronic control unit 20 independently from the type of steering wheel V, and in particular independently from the size and geometry of the flexible conductive element 10 and of the respective conductive tracks 12 and 14.

Preferably, the capacitor 32 is suitably sized as a function of the capacitance read by the capacitive track and of the capacitance reading saturation value of the capacitance reading module 40.

The electronic control unit 20 is further electrically connected to the heating track 12 of the conductive element 10 and supplies such heating track 12 so as to heat the surface of the steering wheel V of the motor vehicle.

As described above, the electronic control unit 20 comprises a power supply module 80, e.g. a linear supply (LDO), electrically connected to the heating track 12 by means of a power output 50, also connected to the microcontroller 30.

Figure 4:
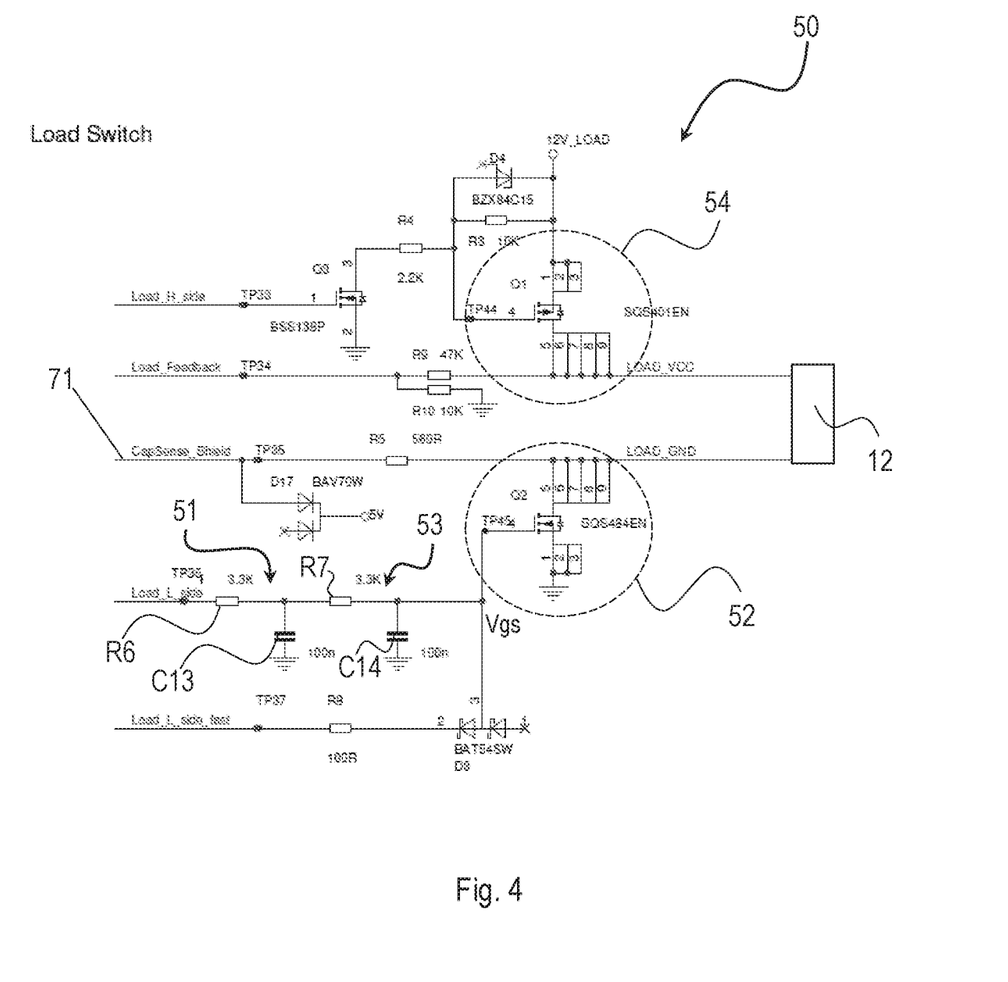
FIG. 4 shows an example of circuit diagram of a module of the device in FIG. 1.

An example of circuit diagram of the power output or heater power output 50 is shown in FIG. 4. In particular, the power output 50 comprises a switch 52, preferably a power MOSFET 52, which connects one of the terminals to ground, in particular terminal 13b of the heating track 12; and another switch 54, preferably a MOSFET 54, which connects the other terminal 13a of the heating track 12 to the power supply source of the vehicle, typically by means of the module 80.

Furthermore, preferably, the ECU 20 is electrically connected to the heating track 12 by means of an electrical connection 71 which, as will be described below, is a connection with shielding functionality.

The heating track 12 preferably has a Positive Temperature Coefficient, or PTC effect, which determines the increase of the ohmic value of the heating track 12 as the temperature increases.

Figure 5:
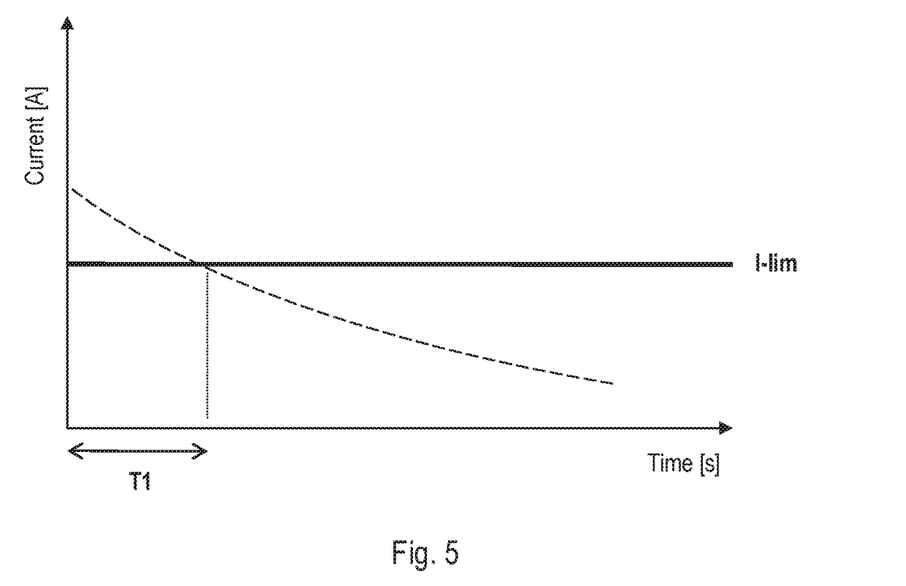
FIGS. 5 and 6 show diagrams of the variation, as a function of time, of the current which cross the heating tracks according to two respective configurations of the device of the invention.
Figure 6:
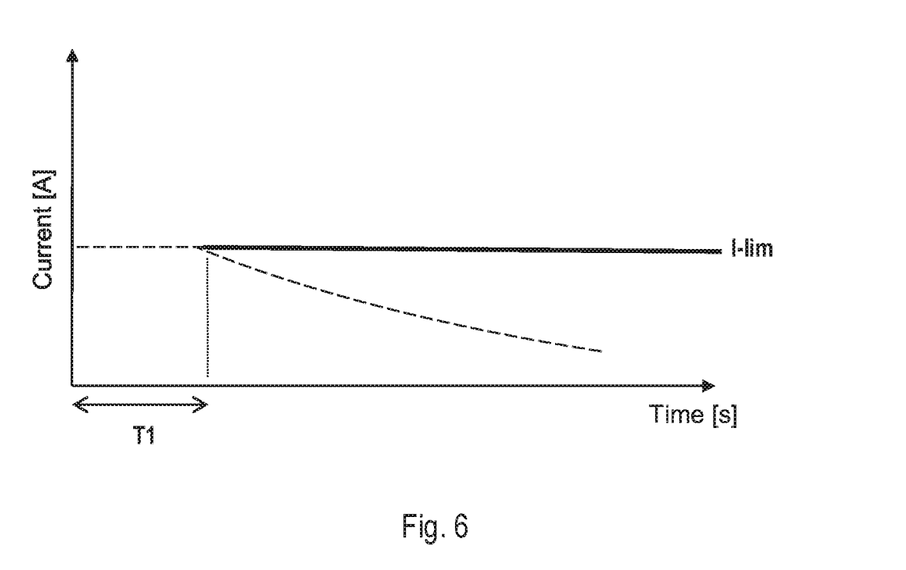

FIG. 5 shows a graph which illustrates the variation over time of the drawn current (dashed line) by the heating track 12. As shown, during the feeding of the track 12, due to the increase of temperature by Joule effect and the consequent increase of the ohmic value of the heating track 12, the drawn current decreases over time.

In the initial step of heating, corresponding to the time interval T1, the current I which crosses the heating track 12 may exceed a predetermined upper current threshold $I_{lim}$ preferably comprised between 7 and 10 A or between 8 and 9 A, e.g. either equal or approximately equal to 8 A, shown in FIG. 5 with a solid line. In order to overcome this drawback, the power MOSFET 52 is managed as a current source. In particular, the MOSFET 52 is configured so as to limit the input current I, taking it to the value $I_{lim}$. This limitation is performed in particular if and when the current which crosses the heating track 12 during the initial time interval T1 of the step of heating exceeds $I_{lim}$. By way of example only, the initial time interval is between 5 s and 20 min, e.g. between 10 s and 10 min. Preferably, the time interval T1 starts when the heating function is enabled, i.e. when power is supplied to the heating track. The MOSFET 52 is configured so that the limitation ceases when the current I which crosses the heating track 12 is lower than the predetermined current threshold value him.

For example, the aforesaid current adjustment is accomplished by modulating the gate voltage Vgs of the power MOSFET 52 through a first RC filter 51 (FIG. 4) and a second RC filter 53 connected in cascade. The first RC filter 51 comprises a resistor R6 and a capacitor C13, while the second RC filter comprises a resistor R7 and a capacitor C14.

By virtue of the presence of these RC filters 51, 53 in cascade, during the current adjustment, the power MOSFET 52 works in linear zone, whereby behaving substantially as a variable equivalent resistor connected in series with the heating track 12.

During the current adjustment described above, a power is dissipated, for example, on the power MOSFET 52 equal to the product of the voltage drop between drain and source of the MOSFET 52 and the current drain-source of the MOSFET 52.

In critical conditions, such power can reach a very high value, e.g., equal to about 30 W, which cannot be dissipated through the printed circuit board 21 of the electronic control unit 20, which has, for example, a surface area of about 12 cm2. In order to dissipate such power, the metal strip 29 associated with, in particular connected to, the printed circuit board 21 of the electronic control unit 20 is advantageously used. Such strip 29 is associated with the printed circuit board 21 near the power MOSFET 52 of the power module 50 and, as described above, advantageously provides a thermal bridge between the printed circuit board and the metal frame of steering wheel V, so as to use such metal frame as a heat sink.

With reference to the heating of the steering wheel V, the electronic control unit 20 of the device 100 is configured so as to adjust the power on the heating track 12, so that the temperature of the steering wheel V is comprised in a predetermined temperature value range, e.g. between 35 and 40° C.

Figure 7:
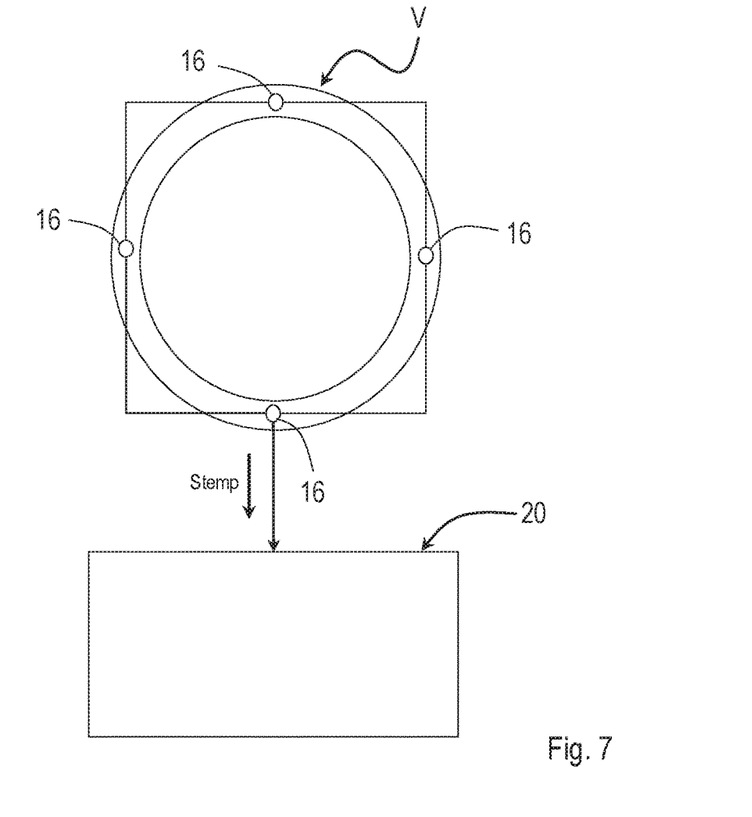
FIG. 7 diagrammatically shows the steering wheel of a motor vehicle with which the device in FIG. 1 is associated.

For this purpose, with reference to FIG. 7, the device 100 according to the invention comprises a plurality of temperature sensors 16, preferably thermistors, appropriately distributed along the circumference of the steering wheel V. Preferably, the number N of the thermistors 16 used is either greater than or equal to three, e.g. four. The thermistors 16 are positioned on the flexible conductive element 10 of device 100, preferably under the leather lining of the steering wheel V, near the heating track 12. The thermistors 16 are connected to one another in series and electrically communicate with the electronic control unit 20, in particular with a steering wheel temperature monitoring module 60, which preferably is part of the electronic control unit 20.

The thermistors 16 measure a total resistance $R_{tot}$ and transmit a signal $s_{temp}$ at the input to the electronic control unit 20.

Such total resistance $R_{tot}$ is obtained from the following formula:

$$R_{tot} = R_1 + R_2 + \ldots + R_N = N \times \left( \frac{R_2 + R_2 + \ldots + RN}{N} \right) = N \times R_{mean}$$

where $R_N$ is the resistance corresponding to the N-th resistor, $R_{tot}$ is the equivalent resistance read at the input of the electronic control unit 20 and $R_{mean}$ is the arithmetic mean of the readings of the N thermistors 16.

Providing a number N of thermistors 16 appropriately distributed along the circumference of the steering wheel V, advantageously reduces the error induced by a localized overheating of the steering wheel V by a factor 1/N. Preferably, thermistors are equally and mutually spaced apart. According to an example, four temperature sensors 16 are provided arranged at approximately 90° from one another when the device 100 is fixed to the steering wheel V.

It has been observed that as a function of external factors, e.g. of the heat generated by solar radiation, warmer zones, i.e. irradiated zones, and shady zones, therefore cooler zones, may be present on the steering wheel. If a single thermistor is provided, instead of a plurality of thermistors, the temperature sensed by such thermistor is greatly affected by its position on the steering wheel V. Experimentally, increments can be observed of the value of the temperature value sensed by a single thermistor up to 15° C., and thus such as to adversely affect the exposure mode accuracy of the steering wheel to sunlight.

Figure 8:
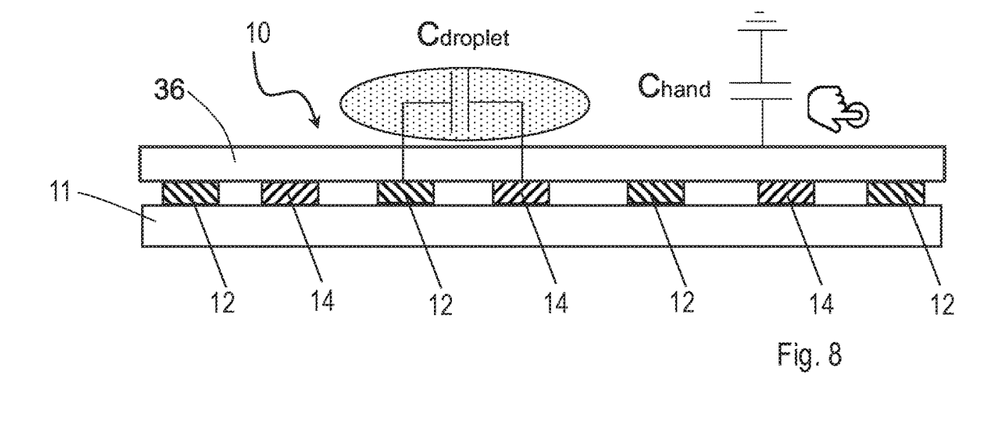
FIG. 8 shows a diagrammatic front section view of a component of the device in FIG. 1, in a particular environmental condition.
Figure 9A:
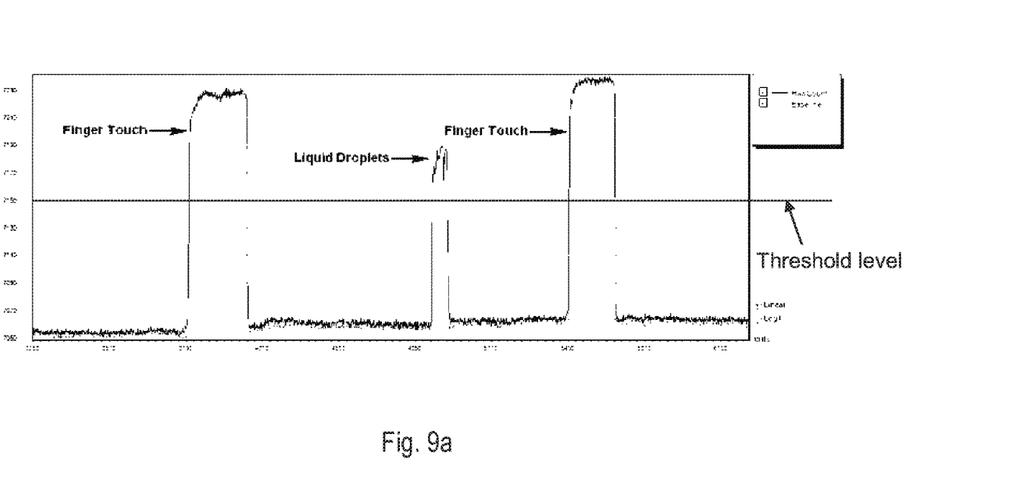
FIGS. 9a and 9b show graphs of the variation of input capacitance in the electronic control unit according to two respective configurations of the device of the invention.
Figure 9B:
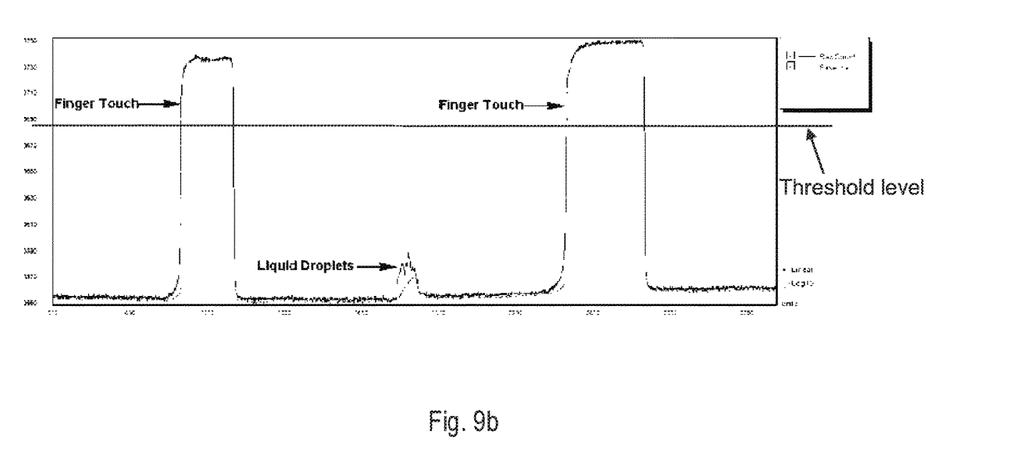

With reference to FIG. 8, some environmental factors, such as moisture and temperature, typically introduce an increase in capacitance, so that Ctot increases by a value substantially equal to Chand even when the driver does not touch the steering wheel. A false touch of the steering wheel is thus sensed. For example, in the case of high humidity, droplets of water may form on the steering wheel V which introduce a capacitance Cdroplet. The parasitic capacitance Cdroplet generated by the droplets of water may in some cases have a value comparable, i.e. similar, to that of the capacitance Chand which is generated when the driver's hands touch the steering wheel V. It follows that the parasitic capacitance Cdroplet transmitted to the electronic control unit 20 in the presence of water droplets on the steering wheel is incorrectly interpreted by the controller 30 as a touch of the steering wheel. The situation is shown in FIG. 9a. FIG. 9a, as well as FIG. 9b commented upon below, shows the variation over time of the capacitance sensed by the ECU 20. It can be noted the touch sensing threshold level and the increase of capacitance due to the touch, indicated by "finger touch", and the increase of capacitance due to water droplets, indicated by "liquid droplets". It is worth noting that the threshold level value in the two FIGS. 9a and 9b is indicative and may be set according to requirements. In order to avoid this "false touch" problem, the ECU 20 is configured to operate a shielding using the heating track 12. In this case, the ECU 20 sets the heating track 12 at the same potential as the capacitive sensor track 14 during the capacitance reading. Consequently, the two ends of each droplet are held at potentials of mutually very similar values. The effect of the parasitic capacitance due to the water droplets is therefore drastically reduced, as shown in FIG. 9b.

Figure 10:
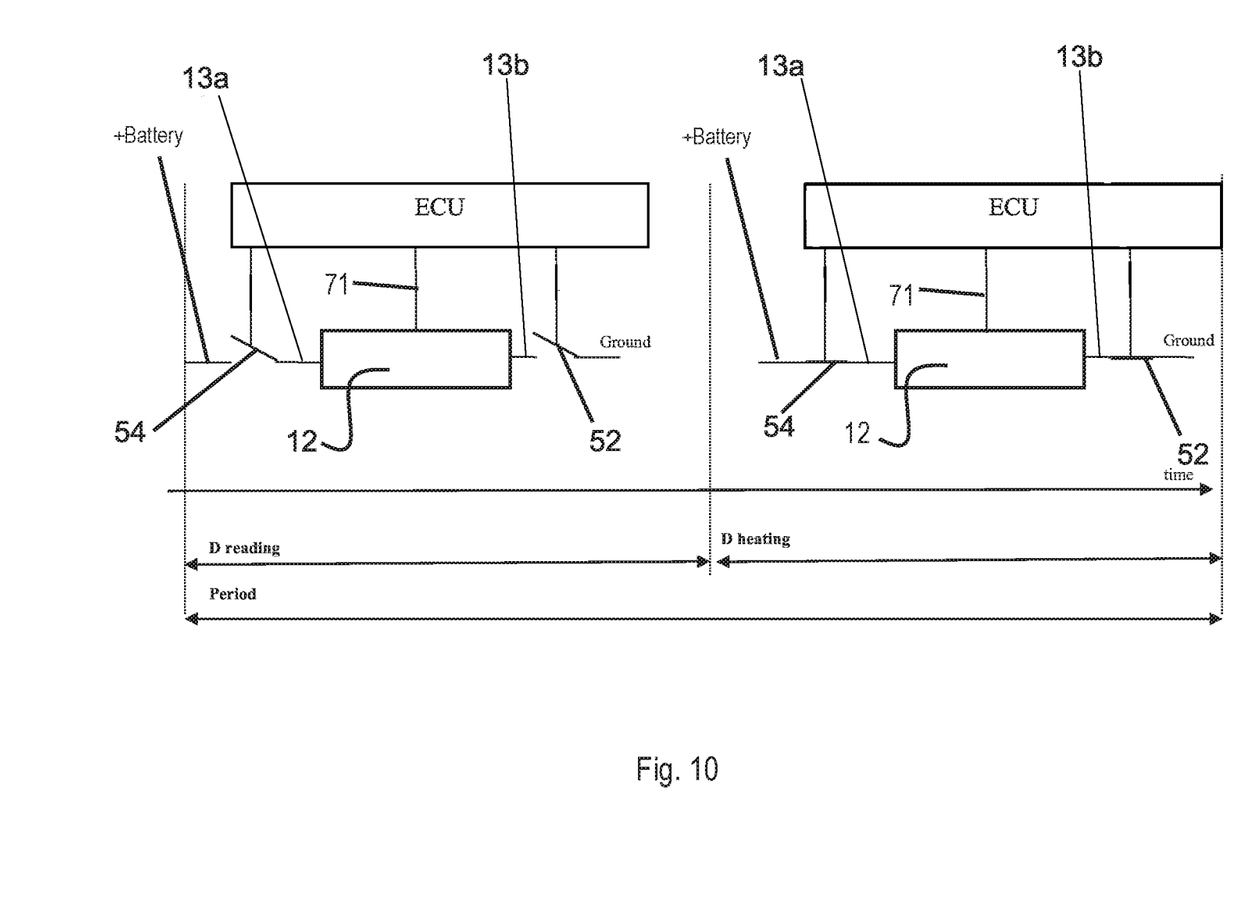
FIG. 10 diagrammatically shows a configuration of a component of the device of the invention, according to an embodiment.

More in particular, with reference to FIG. 10, a period is considered in which the capacitance is read in one part of such period, i.e. for a given time indicated by Dreading, and the heating takes place in one second part, i.e. for a given time, indicated by Dheating. Preferably, the Dreading time is shorter than the Dheating time. More preferably, the Dreading time is comprised between 5 and 90%, e.g. about 10%, of the period, the remaining part of the period being the Dheating time. The time of the total period is preferably comprised between 10 and 100 ms, e.g. about 10 ms.

Figure 11:
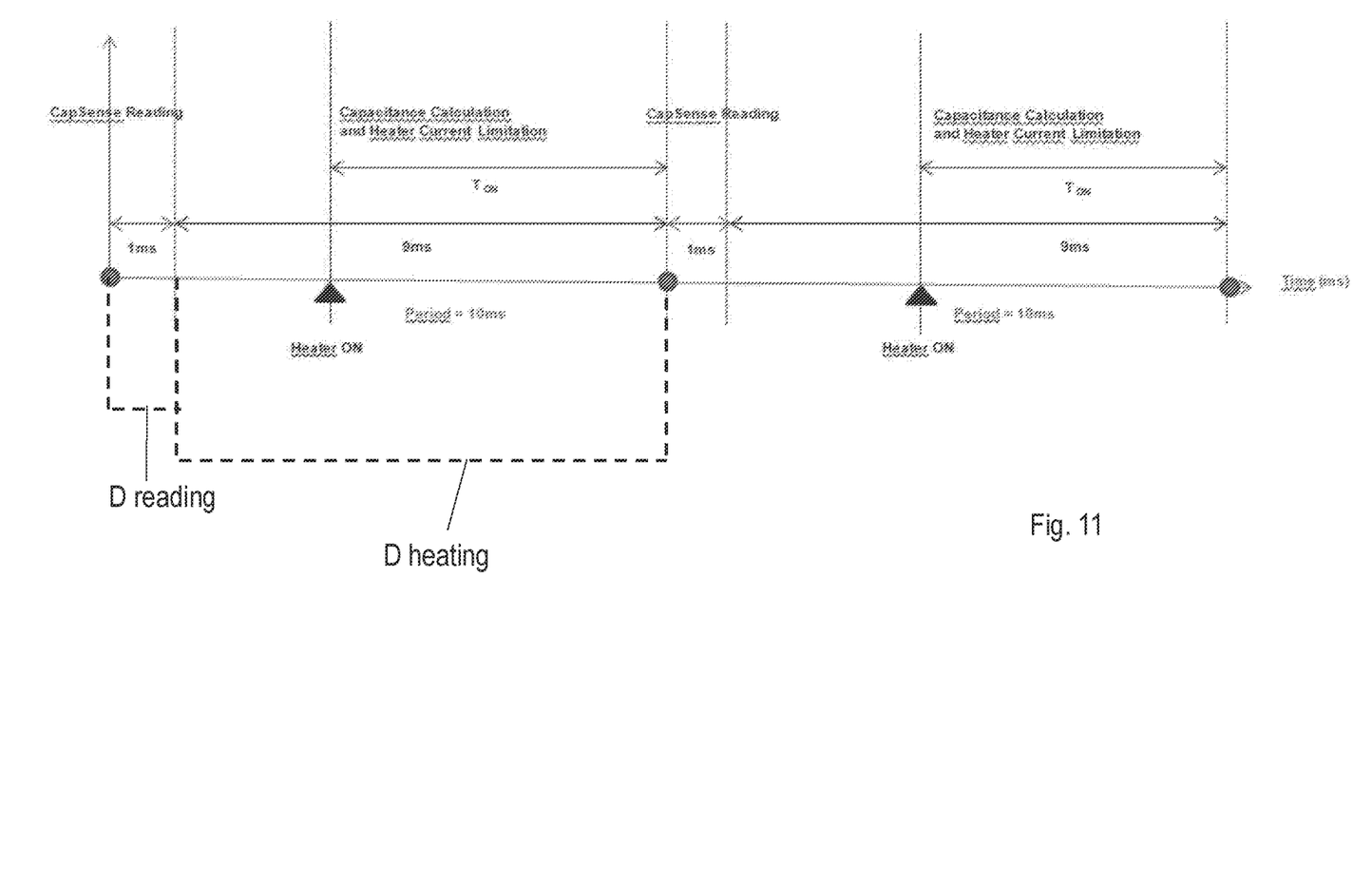
FIG. 11 diagrammatically shows a graph representing part of an operating cycle of the device of the invention, according to an embodiment.

FIG. 11 diagrammatically shows a part of an operating cycle. In particular, two periods are shown in sequence. Each period consists of a step of reading (Dreading) followed by a step of heating (Dheating).

According to an example, the ECU 20 is connected to the heating track 12 through the connection 71, or shielding pin. Switch 52 connects the heating track 12 to ground and switch 54 connects the heating track to the battery (+Battery). The ECU 20 controls the opening and closing of switches 52 and 54. When the switches 52, 54 are open, so that the heating track 12 is disconnected from the battery and from ground, the microcontroller 30 puts the heating track 12 at the same potential as the capacitive track 14, and the capacitance reading is performed in this condition.

FIG. 10 shows the same ECU 20 in two different configurations, which occur in time sequence. During the reading time (Dreading) the ECU 20 disables the heating function, by opening switches SW1 and SW2, so that the heating track 12 is not connected to the power supply, i.e. to the battery and to Ground, as shown on the left of FIG. 10. In this manner, while reading, the heating track 12 is only connected to pin 71 of the ECU 20, which puts it at the same potential as the track of a capacitive sensor 14.

The description is provided only by way of non-limiting example.

The invention claimed is:

1. A heating and capacitive sensing device for a steering wheel of a vehicle, the device comprising:
   a support made of flexible, electrically insulating material, to which are fixed
   at least one first electrically conductive track and at least one second electrically conductive track, distinct from the at least one first track;
   an electronic control unit electrically connected to the at least one first track, configured to be electrically connected to an electrical power source, and comprising a capacitance reading module, electrically connected to the at least one second track, wherein the electronic control unit is configured to control the at least one first track and the at least one second track, so that the at least one first track is adapted to generate heat for heating the steering wheel, and the at least one second track is adapted to operate as capacitive sensing means, sending capacitance values to the electronic control unit;
   the heating and capacitive sensing device further comprising:
   at least one metal strip connected to the electronic control unit, said at least one metal strip being arranged to come into contact with a metal frame of the steering wheel to dissipate heat,
       an electrical connection, which connects the electronic control unit to the at least one first track;
       at least one first switch, which connects the at least one first track to ground, at least one second switch which connects the at least one first track to the electrical power source; and
       wherein the first switch is a MOSFET configured so as to limit the current intensity value across the at least one first track when said current intensity value exceeds a predetermined threshold current intensity value, taking said current intensity value to a value which is either lower than or equal to said predetermined threshold current intensity value.

2. The heating and capacitive sensing device according to claim 1, wherein said at least one metal strip is connected to a printed circuit board of the electronic control unit.

3. The heating and capacitive sensing device according to claim 1, wherein the at least one first track and the at least one second track each have a thickness from 10 to 200 µm.

4. The heating and capacitive sensing device according to claim 1, wherein the electronic control unit comprises at least one capacitor connected in series between the capacitance reading module and the at least one second track.

5. The heating and capacitive sensing device according to claim 1, wherein the electronic control unit is configured to cyclically control the at least one first switch and the at least one second switch so that:

during a step of reading, the at least one first track is electrically disconnected from the electrical power source and from ground, and during a step of heating, the at least one first track is electrically connected to the electrical power source and to ground, the step of reading and the step of heating being performed one after the other to define a cycle of predetermined time, and wherein, during the step of reading, the electronic control unit is configured to set the at least one first track to the same potential as the at least one second track via the electrical connection.

6. The heating and capacitive sensing device according to claim 5, wherein the time of said step of reading is from 5% to 90% of said predetermined cycle time, and the time of said step of heating is from 10% to 95% of said predetermined cycle time, and wherein said predetermined cycle time is from 10 to 100 ms.

7. The heating and capacitive sensing device according to claim 1, comprising a temperature monitoring module and at least one temperature sensor electrically connected to the temperature monitoring module.

8. The heating and capacitive sensing device according to claim 7, comprising at least two temperature sensors said at least two temperature sensors arranged equally spaced on the at least one insulating layer.

9. The heating and capacitive sensing device according to claim 1, wherein the at least one first track and at least one second track are planar.

10. The heating and capacitive sensing device according to claim 4, wherein the capacitance reading module has a saturation value up to 1000 pF, and wherein the at least one capacitor has a capacitance of or up to 2000 pF.

11. The heating and capacitive sensing device according to claim 1, wherein the support is made of a polymeric material; and the at least one first track and the at least one second track are each made of aluminum.

12. The heating and capacitive sensing device according to claim 1, wherein the overall thickness of the at least one insulating layer and of the at least one first track or of the at least one second track is comprised between 0.1 and 1 mm, or between 0.1 and 0.6 mm.

13. The heating and capacitive sensing device according to claim 1, wherein a length of the at least one insulating layer is comprised between 900 and 1200 mm, and a width is comprised between 80 and 160 mm.

14. The heating and capacitive sensing device according to claim 1, wherein the at least one first track has a positive resistivity variation coefficient.

15. The heating and capacitive sensing device according to claim 1, wherein the at least one first track and the at least one second track are each made of a material chosen from aluminum, constantan, copper, German silver, steel, Inconel and brass.

16. The heating and capacitive sensing device according to claim 1, wherein the at least one insulating layer is extensible, being plastically and/or elastically deformable up to 10-20% with respect to an initial configuration of the at least one insulating layer.

17. The heating and capacitive sensing device according to claim 1, comprising two insulating layers, between which the at least one first track and at least one second track are arranged; wherein the two insulating layers are made of PVC; and wherein each of the two insulating layers is about 0.2 mm thick.

18. The heating and capacitive sensing device according to claim 1, wherein said predetermined threshold current intensity value is between 7 and 10 A.

19. A vehicle steering wheel including a heating and capacitive sensing device, the device comprising:

a support made of flexible, electrically insulating material, to which are fixed at least one first electrically conductive track and at least one second electrically conductive track, distinct from the at least one first track;

an electronic control unit electrically connected to the at least one first track, configured to be electrically connected to an electrical power source, and comprising a capacitance reading module, electrically connected to the at least one second track, wherein the electronic control unit is configured to control the at least one first track and the at least one second track, so that the at least one first track is adapted to generate heat for heating the steering wheel, and the at least one second track is adapted to operate as capacitive sensing means, sending capacitance values to the electronic control unit;

the heating and capacitive sensing device further comprising:

at least one metal strip connected to the electronic control unit, said at least one metal strip being arranged to come into contact with a metal frame of the steering wheel to dissipate heat, an electrical connection, which connects the electronic control unit to the at least one first track;

at least one first switch, which connects the at least one first track to ground, at least one second switch which connects the at least one first track to the electrical power source; and wherein the first switch is a MOSFET configured so as to limit the current intensity value across the at least one first track when said current intensity value exceeds a predetermined threshold current intensity value, taking said current intensity value to a value which is either lower than or equal to said predetermined threshold current intensity value.

20. The steering wheel according to claim 19, comprising at least two temperature sensors, said at least two temperature sensors being preferably arranged mutually and equally spaced apart at about 90° from one another; and wherein said at least two temperature sensors are arranged between the at least one insulating layer and a lining layer of the steering wheel.

21. The steering wheel according to claim 19, wherein the device comprises two insulating layers between which the at least one first track and at least one second track are arranged; wherein an insulating layer is arranged around a body of the steering wheel, around the metal frame, and the other insulating layer is lined with a lining layer-of the steering wheel;

wherein the two insulating layers are made of PVC; and
wherein each of the two insulating layers is about 0.2 mm thick.

* * * * *